United States Patent
Shih et al.

(10) Patent No.: US 10,352,965 B2
(45) Date of Patent: Jul. 16, 2019

(54) TESTING DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yu-Ting Shih, Hsinchu (TW); Chia-Jung Hsieh, Hsinchu (TW); Chia-Jen Kao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 272 days.

(21) Appl. No.: 15/619,536

(22) Filed: Jun. 11, 2017

(65) Prior Publication Data

US 2018/0196085 A1 Jul. 12, 2018

(30) Foreign Application Priority Data

Jan. 10, 2017 (CN) .......................... 2017 1 0016081

(51) Int. Cl.

| | | |
|---|---|---|
| *G01R 1/04* | (2006.01) | |
| *G01R 1/067* | (2006.01) | |
| *G01R 1/073* | (2006.01) | |
| *G01R 1/28* | (2006.01) | |
| *G01R 1/44* | (2006.01) | |
| *G01R 31/02* | (2006.01) | |
| *G01R 31/20* | (2006.01) | |
| *G01R 31/26* | (2014.01) | |
| *G01R 31/28* | (2006.01) | |

(52) U.S. Cl.
CPC ....... *G01R 1/06794* (2013.01); *G01R 1/0466* (2013.01); *G01R 1/06722* (2013.01)

(58) Field of Classification Search
CPC .......... G01R 1/04; G01R 1/067; G01R 1/073; G01R 1/28; G01R 1/44; G01R 31/02; G01R 31/20; G01R 31/26; G01R 31/28; G01R 31/2891
See application file for complete search history.

(56) References Cited

U.S. PATENT DOCUMENTS

| | | | |
|---|---|---|---|
| 2015/0192609 A1* | 7/2015 | Hsu ...................... | G01R 1/0416 324/754.03 |
| 2015/0192610 A1* | 7/2015 | Tang .................... | G01R 1/0491 324/756.02 |

* cited by examiner

*Primary Examiner* — Neel D Shah
(74) *Attorney, Agent, or Firm* — CKC & Partners Co., LLC

(57) ABSTRACT

A testing device includes a circuit board, a carrier, a probe pin, a main body, a shaft, a pressing portion and a resilient spiral spring. The carrier is used to hold a device under test (DUT). The probe pin is electrically connected to the circuit board and the DUT. The shaft is movably connected to the main body with a screwing rotation method. The pressing portion is connected to one end surface of the shaft. The resilient spiral spring is retractably coiled on the shaft, and one end of the resilient spiral spring being far away from the shaft extends in a transverse direction intersecting an axial direction of the shaft.

13 Claims, 9 Drawing Sheets

TESTING DEVICE

RELATED APPLICATIONS

This application claims priority to China Application Serial Number 201710016081.8, filed Jan. 10, 2017, which is herein incorporated by reference.

BACKGROUND

Field of Disclosure

The present disclosure relates to a testing device. More particularly, the present disclosure relates to a testing device which presses a device under test (DUT).

Description of Related Art

In the past, when being tested by a testing personnel, a tested object (i.e., a device under test, DUT) is continuously pressed by a hand or hands of the testing personnel so as to contact testing probe pins for testing. After the DUT has been tested, the hand or hands of the testing personnel hands leave the DUT.

However, when the number of the DUTs is huge, in a long term, not only testing time and cost dramatically increase, but also the testing personnel is quite likely to have occupational injury and thus her or his health is affected. In addition, because the testing personnel hardly can control the pressing stroke and pressure of pressing the DUT with her or his hands to be the same at each time of testing, the pressure exerted by the testing personnel on the DUT cannot be guaranteed to be an expected value at each time of testing. DUTs may be often excessively pressed and damaged, thus reducing the testing efficiency to the DUT.

SUMMARY

An aspect of the disclosure is to provide a testing device to resolve the aforementioned inconvenience and deficiencies.

According to one embodiment, the testing device includes a testing circuit, a carrier, a probe pin, a main body, a shaft, a pressing portion and a resilient spiral spring. The carrier carries a device under test (DUT). The probe pin is electrically connected to the circuit board and the DUT. The shaft is movably connected to the main body in accordance with a screwing rotation method. The pressing portion is connected to one end surface of the shaft. The resilient spiral spring is retractably coiled on the shaft, and one end of the resilient spiral spring being far away from the shaft extends in a transverse direction intersecting an axial direction of the shaft. When the end of the resilient spiral spring is pulled in the transverse direction for rotating the shaft, the shaft moves towards the DUT in the axial direction of the shaft to move the pressing portion to press the DUT to abut against the at least one probe pin.

As disclosed above, compared to the conventional arts, the solution provided by the present disclosure has the following advantages and beneficial effects. With the aforementioned solutions, the technical improvement and practicability are provided and widely applicable to the relative industries, in which the solution provided by the present disclosure at least has the following advantages:

1. the testing procedure of the testing device is accelerated, thereby reducing the testing time and cost;

2. the possibilities of the occupational injury occurring to the testing personnel are decreased; and 3. the expected pressure value for pressing on the DUT can be guaranteed by the constant pressing stroke to the DUT at each time of testing, thereby improving testing efficiency of the testing device to the DUT.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
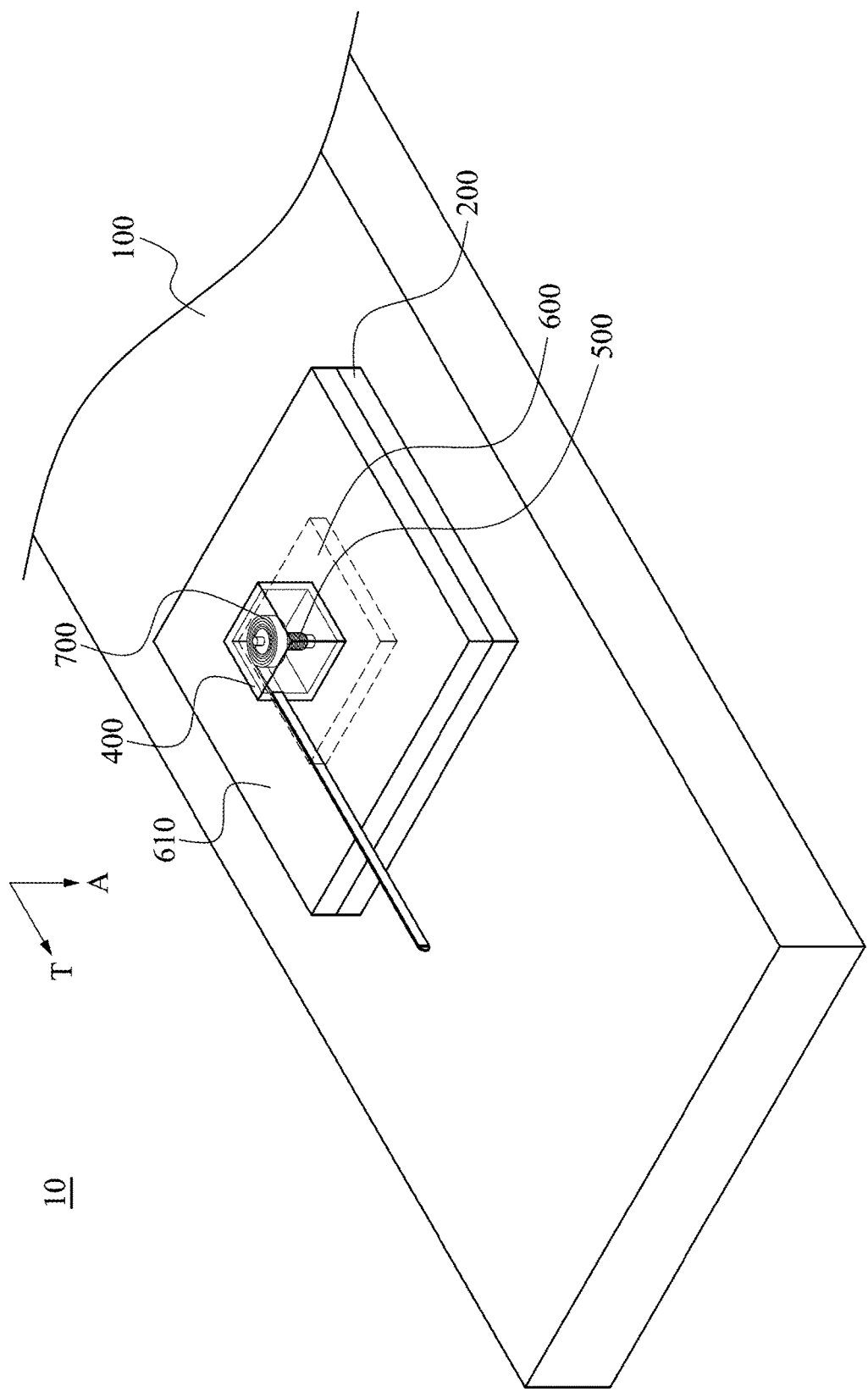
FIG. 1 is a schematic perspective view of a testing device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 2A:
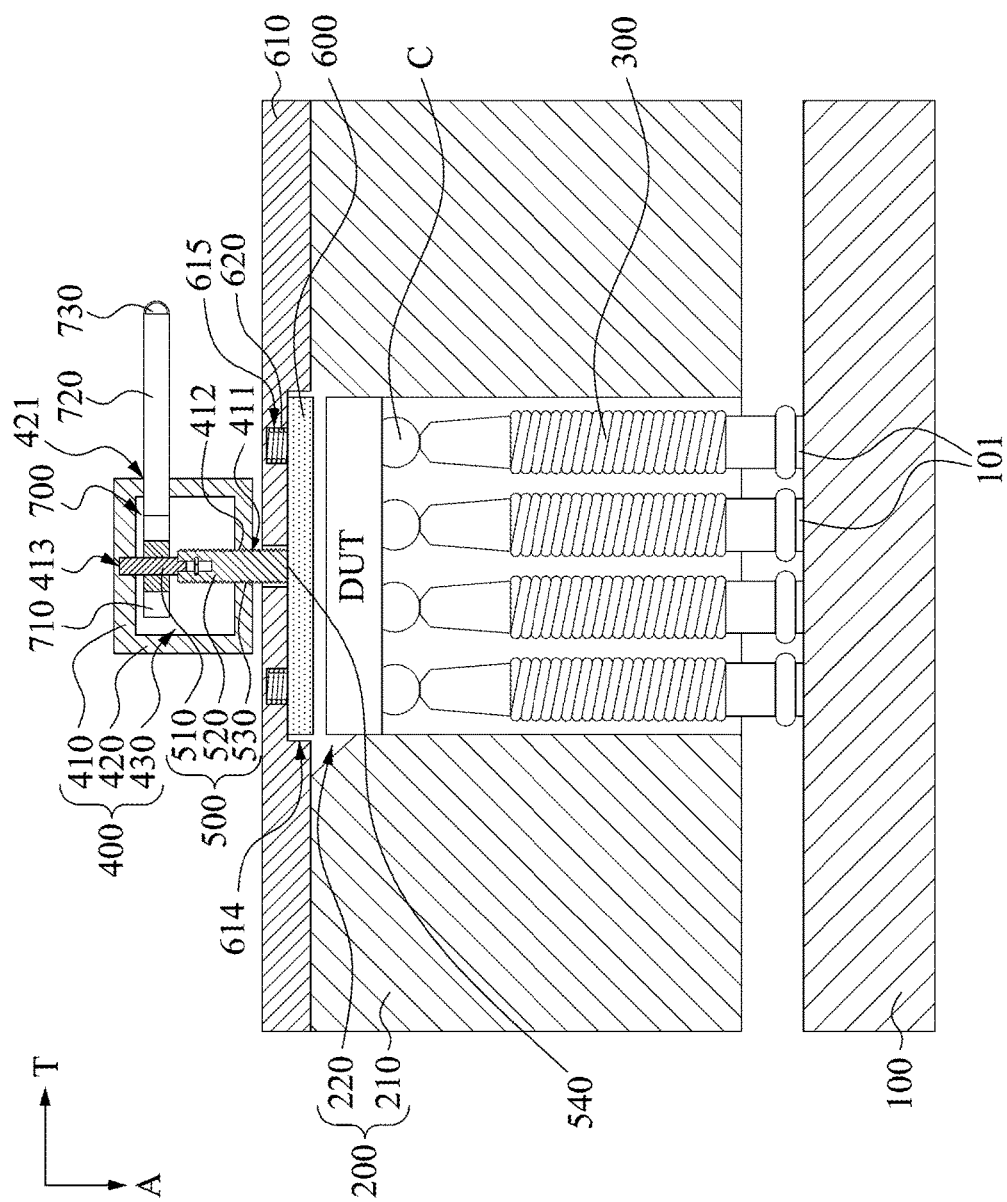
FIG. 2A is an schematic operational view of the testing device of FIG. 1 when not pressing DUT yet according to one embodiment of the disclosure.
Figure 2B:
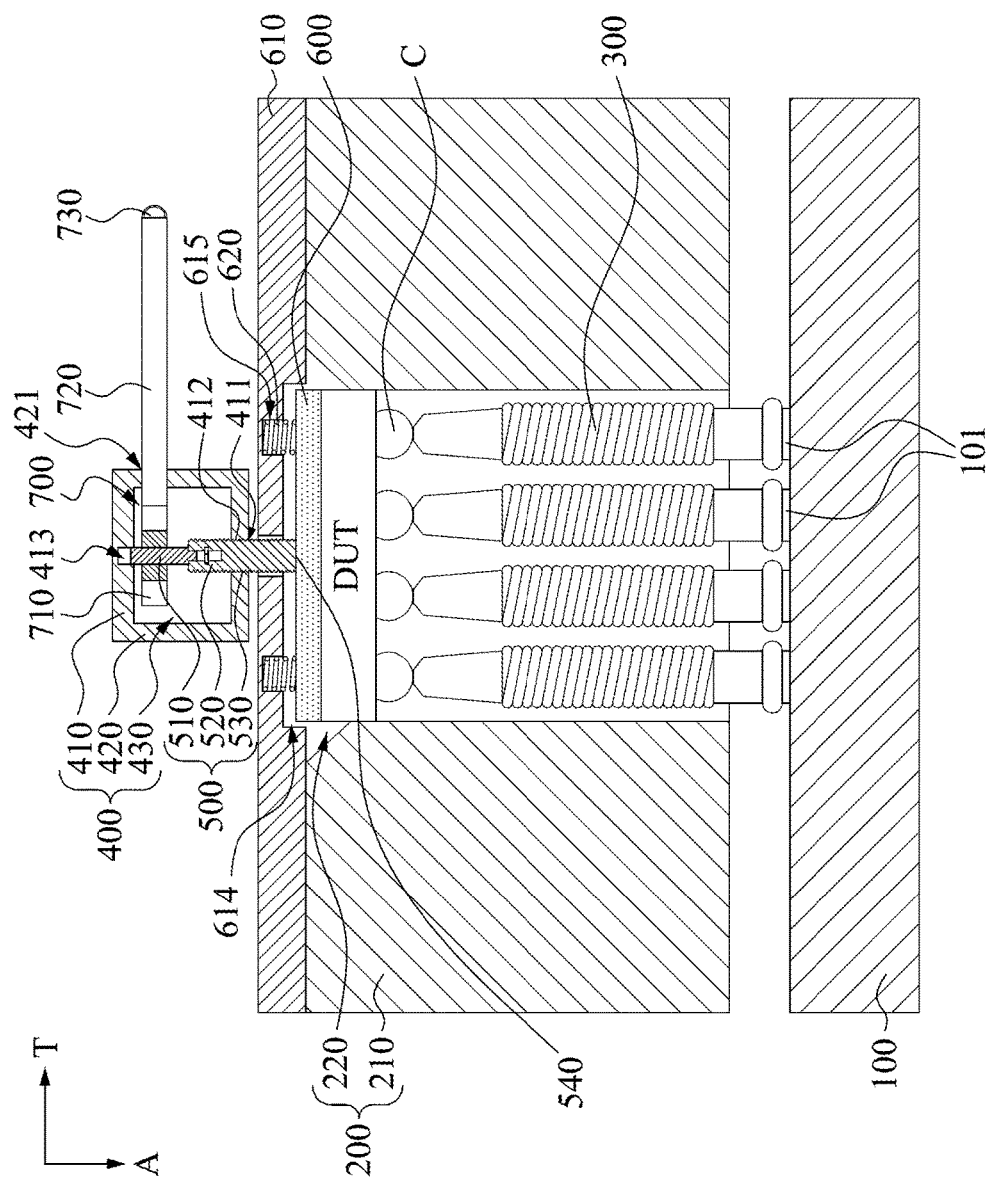
FIG. 2B is an schematic operational view of the testing device of FIG. 1 when pressing DUT according to one embodiment of the disclosure.

Reference is now made to FIG. 1, FIG. 2A and FIG. 2B, in which FIG. 1 is a schematic perspective view of a testing device 10 according to one embodiment of the disclosure, FIG. 2A is a schematic operational view of the testing device 10 of FIG. 1 which does not press a DUT according to one embodiment of the disclosure, and FIG. 2B is a schematic operational view of the testing device 10 of FIG. 1 which presses DUT according to one embodiment of the disclosure. As shown in FIG. 1 and FIG. 2A, the testing device 10 includes a circuit board 100, a carrier 200, probe pins 300 (or at least one probe pin), a main body 400, a shaft 500, a pressing portion 600 and a resilient spiral spring 700. The carrier 200 is used to hold a device under test (DUT). Each of the probe pins 300 is electrically connected to the circuit board 100 and the DUT, in which two opposite ends of each of the probe pins 300 are respectively electrically connected to one of contacts C of the DUT and one of contacts 101 of the circuit board 100. The shaft 500 is movably connected to the main body 400 in accordance with a screwing rotation method. The pressing portion 600 is connected to one end surface 540 of the shaft 500. The resilient spiral spring 700 is retractably coiled on the shaft 500, in which the resilient spiral spring 700 has a first end 710 and a second end 720 being opposite to the first end 710, and the first end 710 of the resilient spiral spring 700 is coiled on the shaft 500, and one end (i.e., the second end 720) of the resilient spiral spring 700 which is far away from the shaft 500 extends in a transverse direction T. The transverse direction T intersects (e.g., orthogonal or approximately orthogonal) an axial direction A of the shaft 500.

Therefore, as shown in FIG. 2B, when the second end 720 of the resilient spiral spring 700 is pulled in the transverse direction T by a testing personnel, the shaft 500 is rotated about the axial direction A of the shaft 500 by a screwing rotation method, and the rotating shaft 500 descends to gradually approach the DUT in the axial direction A of the shaft 500 for pushing the pressing portion 600 to press the DUT eventually. Thus, the contacts C of the DUT respectively abut against the probe pins 300 tightly so as to improve testing efficiency of the testing device 10 to the DUT. At this moment, the resilient spiral spring 700 which has been pulled is deformed to store a restoring force. In contrast, returning to FIG. 2A, when the second end 720 of the resilient spiral spring 700 which has been pulled is released, the restoring force automatically restores the resilient spiral spring 700 back to its original coiling state, and the resilient spiral spring 700 rotates the shaft 500 reversely about the axial direction A of the shaft 500 by the screwing rotation method, such that the shaft 500 and the pressing portion 600 are collectively lifted from the DUT gradually in the axial direction A, and thus the DUT can be removed from the carrier 200.

Therefore, the testing procedure of the DUT can be completed in a short time by pulling the second end 720 of the resilient spiral spring 700 in the transverse direction T and then releasing the second end 720 of the resilient spiral spring 700 by the testing personnel, and thus not only the testing procedure of the testing device to the DUT can be accelerated so as to reduce the testing time and cost, but also physical fatigues on hands of the testing personnel can be relieved, thereby decreasing the possibilities of the occupational injury occurring to the testing personnel.

Specifically, as shown in FIG. 2A, the main body 400 has two first side walls 410 and plural second side walls 420. The first side walls 410 are arranged opposite to each other, and the second side walls 420 respectively adjoin the first side walls 410 and surround the first side walls 410 so as to collectively define an accommodation space 430. The accommodation space 430 is used to receive a portion of the shaft 500 and the resilient spiral spring 700. Also, one of the first side walls 410 is formed with a screw hole 411 communicating with the accommodation space 430, and the screw hole 411 is provided with an internal threaded portion 412 at its inner wall. The other of the first side walls 410 is formed with an accommodating recess 413 communicating with the accommodation space 430, and the accommodating recess 413, for example, may be a blind hole. However, in another embodiment, the accommodating recess 413 may be a through hole. One of the second side walls 420 is formed with a slot 421, and the second end 720 of the resilient spiral spring 700 can extend outwards from the accommodation space 430 of the main body 400 via the slot 421.

A portion of the shaft 500 extends outwards from the accommodation space 430 of the main body 400 through the screw hole 411. The shaft 500 is provided with an external threaded portion 530. In specific, the shaft 500 includes a support pole 510 and a screw bolt 520. One end of the support pole 510 is received in the accommodation space 430, and the other end of the support pole 510 is connected to the screw bolt 520. The support pole 510 is coaxial with the screw bolt 520, and the support pole 510 is coiled by the resilient spiral spring 700. The screw bolt 520 is disposed between the support pole 510 and the pressing portion 600. The external threaded portion 530 is formed on an outer surface of the screw bolt 520, and the external threaded portion 530 is disposed between the resilient spiral spring 700 and the pressing portion 600. When the screw bolt 520 is inserted in the screw hole 411, by using the external threaded portion 530 engaged screwedly with the internal threaded portion 412, the screw bolt 520 can be rotated about the axial direction A of the shaft 500 in accordance with the screwing rotation method, so as to linearly ascend or descend in the accommodation space 430.

When the screw bolt 520 linearly descends in the accommodation space 430, one end of the support pole 510 disposed in the accommodating recess 413 gradually descends towards the accommodation space 430 (FIG. 2B), but does not completely leave the accommodating recess 413. Therefore, when the screw bolt 520 linearly ascends into the accommodation space 430, the end of the support pole 510 opposite to the screw bolt 520 can move back to the bottom surface of the accommodating recess 413. In the embodiment, the end surface 540 of the shaft 500 (i.e., the screw bolt 520) is oriented towards a surface of the pressing portion 600, that is, the end surface 540 of the shaft 500 (i.e., the screw bolt 520) is removably connected to the surface of the pressing portion 600, or the end surface 540 of the shaft 500 and the surface of the pressing portion 600 are only separated by a small pitch. Thus, as shown in FIG. 2B, when the shaft 500 moves towards the DUT in the axial direction A of the shaft 500, the shaft 500 pushes the pressing portion 600 to move linearly in the axial direction A of the shaft 500.

The carrier 200 includes a base 210 and a loading portion 220. The loading portion 220 is formed in a concaved shape, and is formed on one surface of the base 210. The probe pins 300 are arranged abreast on the base 210, and are collectively extended into the loading portion 220. Each of the probe pins 300 is electrically connected to one of contacts C of the DUT and one of contacts 101 of the circuit board 100. The circuit board 100 is externally connected to a testing computer (not shown in figures), such that the testing computer can be electrically connected to the DUT through the circuit board 100 and the probe pins 300.

The testing device 10 further includes a covering lid 610 for covering the loading portion 220 (i.e., the DUT) of the carrier 200. The covering lid 610 is disposed on the carrier 200, and disposed between the main body 400 and the pressing portion 600. The size of the pressing portion 600 is smaller than the size of the covering lid 610, and the pressing portion 600 is arranged to be aligned with the DUT received in the loading portion 220 for directly pressing the DUT after being moved into the loading portion 220. A trough 614 is concavely formed on one surface of the covering lid 610 oriented towards the loading portion 220, and the pressing portion 600 is received in the trough 614. The shaft 500 penetrates through the covering lid 610, such that the end surface 540 of the shaft 500 abuts the pressing portion 600 received in the trough 614. The testing device 10 further includes two elastic elements 620. Each of the elastic elements 620 is disposed between the pressing portion 600 and the covering lid 610. For example, each of the elastic elements 620 is disposed in an opening 615 formed on a bottom of the trough 614 of the covering lid 610, and two opposite ends of each of the elastic elements 620 are respectively connected to the pressing portion 600 and the covering lid 610. Thus, when the end surface 540 of the shaft 500 does not press the pressing portion 600, restoring forces of the deformed elastic elements 620 can pull the pressing portion 600 back towards the covering lid 610 in the axial direction A of the shaft 500. However, the disclosure is not limited thereto, and in another embodiment, each of the elastic elements 620 may be connected to the pressing portion 600 and another stationary object such as main body and the carrier. It is noted that the stationary object is not moved with the shaft. The resilient spiral spring 700 is a constant torque spring. The constant torque spring, also known as a constant force spring, roll, winding, is made by rolling a high-strength stainless steel strip.

Figure 3:
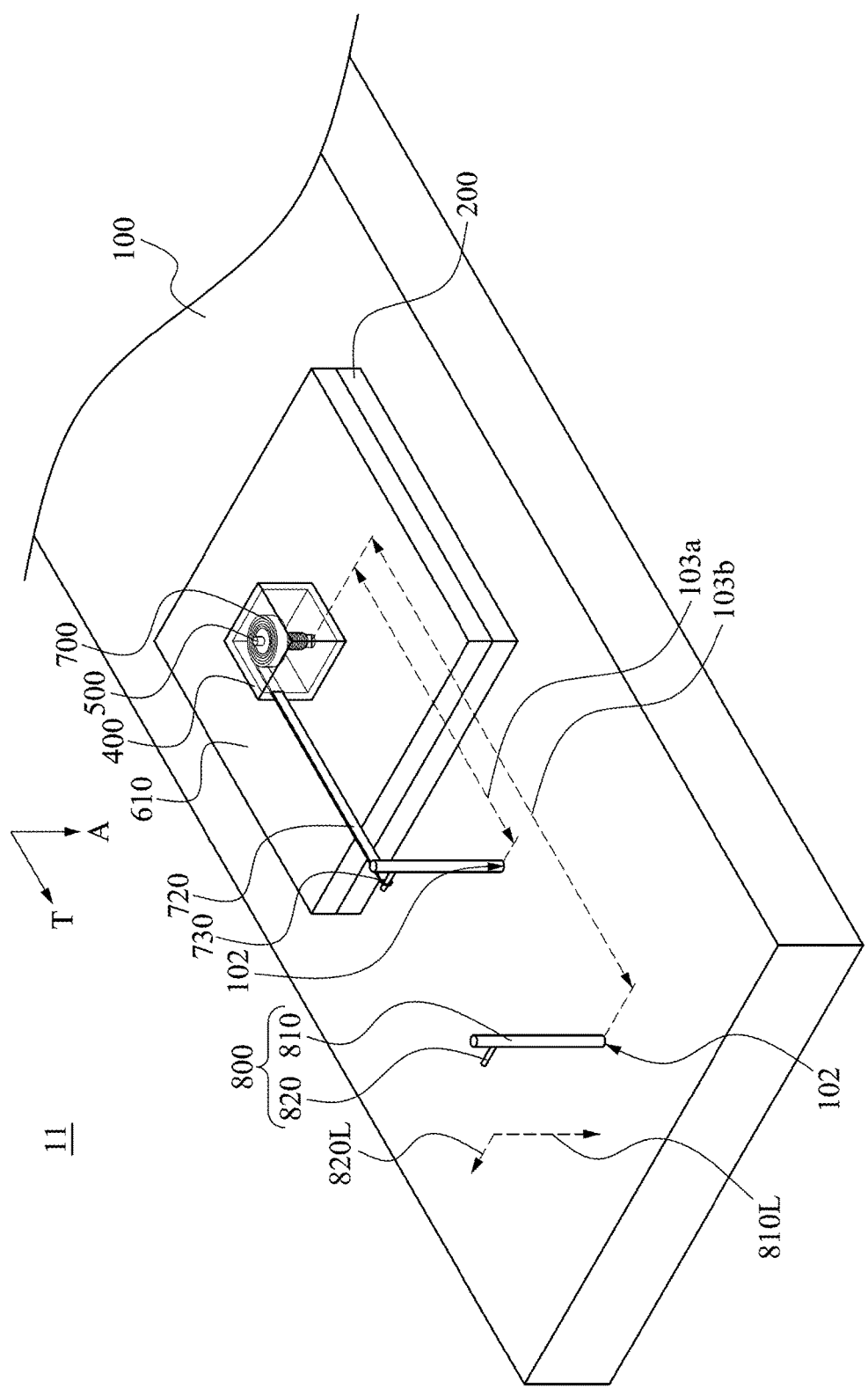
FIG. 3 is a schematic perspective view of a testing device according to one embodiment of the disclosure.

FIG. 3 is a schematic perspective view of a testing device 11 according to one embodiment of the disclosure. As shown in FIG. 3, the testing device 11 further includes two (or at least one) fixing pins 800. Each of the fixing pins 800 is uprightly disposed on one surface of the circuit board 100, and is spaced from the shaft 500 at a specific distance. The major axis direction 810L of each of the fixing pins 800 is parallel (or approximately parallel) to the axial direction A of the shaft 500. More particularly, each of the fixing pins 800 includes a linear pole 810 and a lug 820. The major axis direction 810L of the linear pole 810 is parallel (or approximately parallel) to the axial direction A of the shaft 500. The lug 820 is disposed on a portion of the linear pole 810 between two ends of the linear pole 810, and the major axis direction 820L of the lug 820 is perpendicular (or approximately perpendicular) to the major axis direction 810L of the linear pole 810. Furthermore, the length of the lug 820 is smaller than the length of the linear pole 810. Therefore, when the testing personnel pulls the second end 720 of the resilient spiral spring 700 in the transverse direction T, the testing personnel uses a fixing ring 730 of the second end 720 of the resilient spiral spring 700 to hook onto the lug 820 of the fixing pins 800, such that the second end 720 of the resilient spiral spring 700 which has been pulled can be held and does not restore to the original coiling state thereof.

Since the distance between the fixing pin 800 and the shaft 500 is determined, the expected pressure value onto the DUT can be guaranteed by the constant pressing stroke and the constant pressure exerted on the DUT at each time of testing, thereby improving the testing efficiency of the testing device 10 to the DUT. Furthermore, the testing personnel only needs to pull the second end 720 of the resilient spiral spring 700 from the main body 400 to the fixing pin 800 without needing to notice how long the resilient spiral spring 700 has been pulled out, thereby reducing the working difficulty for the testing personnel.

It is noted, the position of any fixing pin 800 installed on the circuit board 100 can be designed intentionally so that a predetermined straight length of the pulled part of the resilient spiral spring 700 reaching the fixing pin 800, which matches a corresponding pressure value of the pressing portion 600 to resist the DUT can be set.

In the embodiment, each of the fixing pins 800 is detachably disposed on one surface of the circuit board 100, and a minimum linear distance existing between each of the fixing pins 800 and the shaft 500 is adjustable. For example, as shown in FIG. 3, the surface of the circuit board 100 is formed with a plurality of inserted holes 102. The inserted holes 102 are arranged in a straight-line arrangement, and the minimum linear distance 103a between one of the fixing pins 800 and the shaft 500, and the minimum linear distance 103b between the other fixing pin 800 and the shaft 500 are different. One of the fixing pins 800 can be selected to insert into anyone of the inserted holes 102. Therefore, when the testing personnel pulls the resilient spiral spring 700 to one of the fixing pins 800 by holding the fixing ring 730 disposed on the second end 720 of the resilient spiral spring 700, the testing personnel hooks the lug 820 of the fixing pin 800 with the fixing ring 730 for exerting the specific pressure on the pressing portion 600 to resist the DUT.

Figure 4:
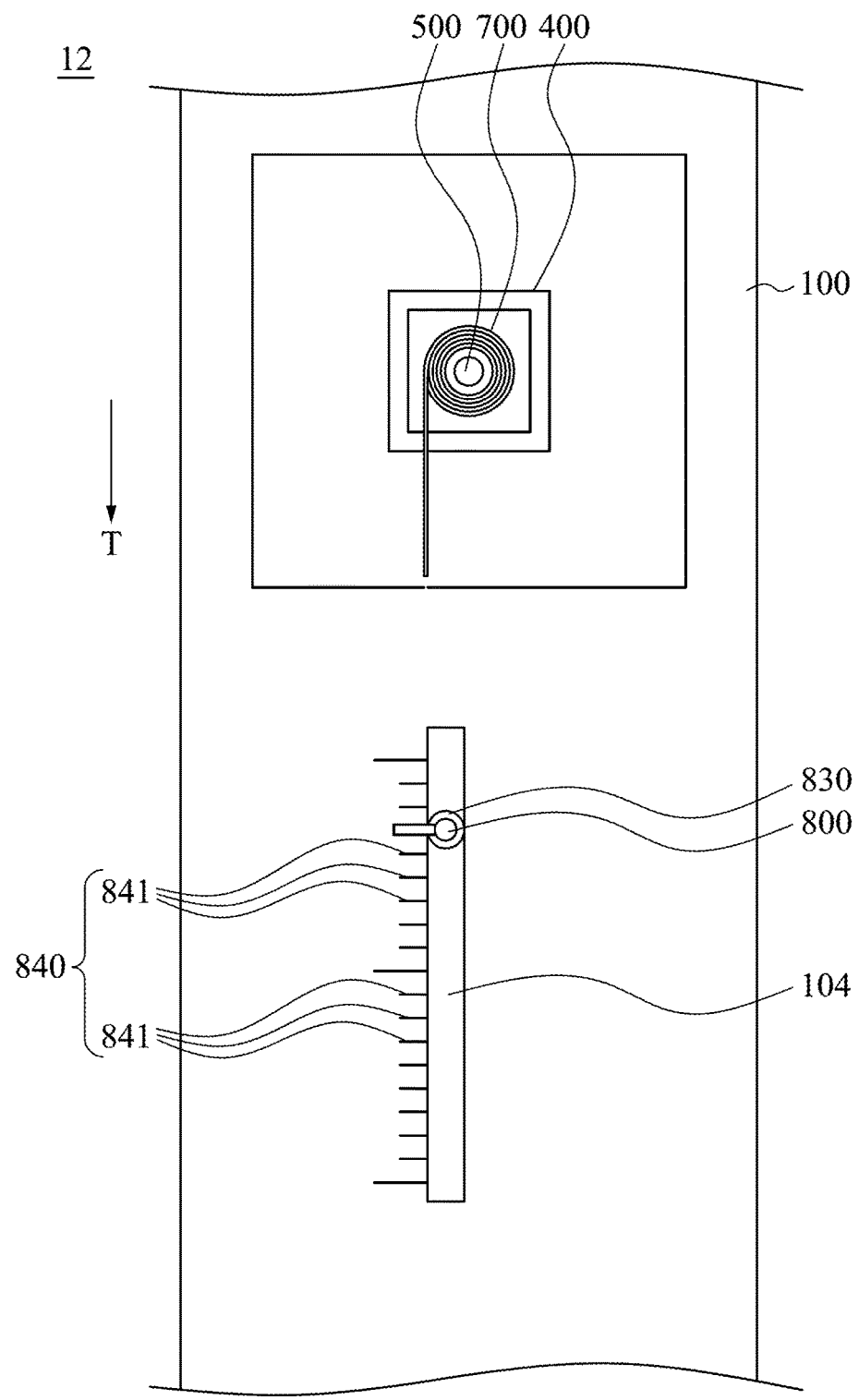
FIG. 4 is a schematic top view of a testing device according to one embodiment of the disclosure.

FIG. 4 is a schematic perspective view of a testing device 12 according to one embodiment of the disclosure. As shown in FIG. 4, the testing device 12 of FIG. 4 is substantially the same with the testing device 11 of FIG. 3, expect that one of the fixing pins 800 is slidably disposed on the surface of the circuit board 100. In other words, the gap (i.e., minimum linear distance) between the fixing pin 800 and the shaft 500 can be easily adjusted by sliding the fixing pin 800 towards or away from the shaft 500, and thus the fixing pin 800 in this embodiment does not need to be pulled out from the surface of the circuit board 100 for adjusting the minimum linear distance between the fixing pin 800 and the shaft 500. For example, the circuit board 100 is formed with a linear rail 104 on the surface thereof. One end of the fixing pin 800 is provided with a slider 830 which is slidably disposed in the linear rail 104 so as to move slidably the fixing pin 800 in the transverse direction T.

Also, the circuit board 100 is further provided with a gauge scale 840 disposed on the surface of the circuit board 100 along the linear rail 104. The gauge scale 840 is provided with scale values 841. Different scale values 841 respectively represent different distances between the shaft 500 and the position of each of the scale values 841 printed. Thus, the testing personnel can slide the fixing pin 800 to align with one of the scale values 841 for deciding the distance between the shaft 500 and the fixing pin 800 without needing to use a ruler for gauging the distance therebetween, thereby reducing the working difficulty for the testing personnel.

Figure 5:
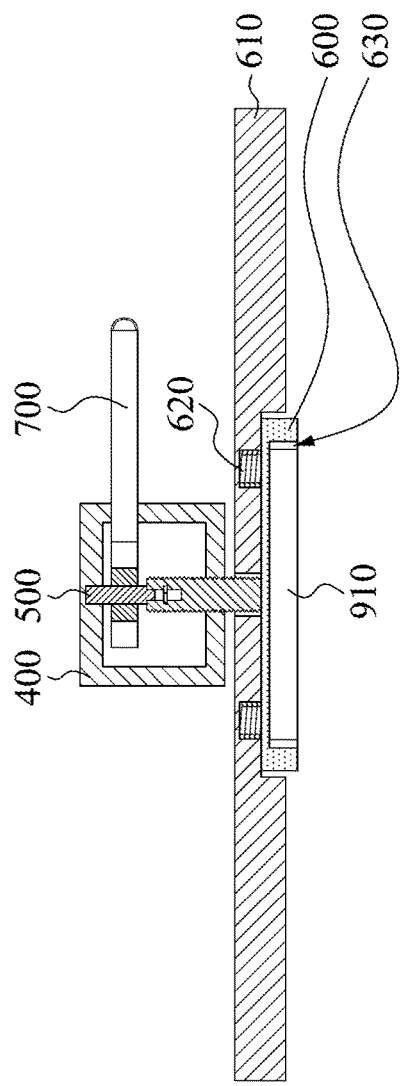
FIG. 5 is a cross-sectional view of a testing device according to one embodiment of the disclosure.

FIG. 5 is a schematic cross-sectional view of a testing device 13 according to one embodiment of the disclosure. As shown in FIG. 5, the testing device 13 of FIG. 5 is substantially the same as the testing device 10 of FIG. 1, expect that the testing device 13 in the embodiment further includes a pressure sensor 910. The pressure sensor 910 is disposed on one surface of the pressing portion 600 opposite to the main body 400. For example, the pressure sensor 910 is disposed on one surface of the loading portion 220 oriented towards the carrier 200 for sensing the pressure value of the pressing portion 600 directly resisting the DUT. Thus, once the testing personnel pulls the second end 720 of the resilient spiral spring 700 for a certain length until the pressure value of the pressing portion 600 sensed by the pressure sensor 910 reaches a preset threshold, the testing personnel does not need to notice how long the resilient spiral spring 700 has been pulled out, thereby reducing the working difficulty for the testing personnel.

Furthermore, in the embodiment, the pressing portion 600 is formed with a concaved portion 630 on the surface of the pressing portion 600 facing the carrier 200. The pressure sensor 910 is received in the concaved portion 630. One surface of the pressure sensor 910 is coplanar with the surface of the pressing portion 600 facing the carrier 200.

Figure 6:
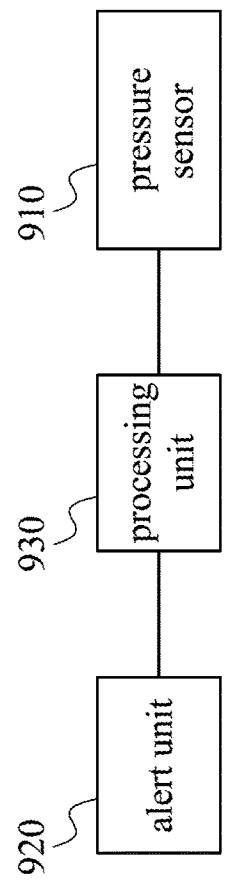
FIG. 6 is a functional block diagram of the testing device of FIG. 5 according to one embodiment of the disclosure.

FIG. 6 is a functional block diagram of the testing device 13 of FIG. 5 according to one embodiment of the disclosure. As shown in FIG. 5 and FIG. 6, the testing device of FIG. 6 is substantially the same as the testing device 13 of FIG. 5, expect that the testing device in the embodiment further includes an alert unit 920 and a processing unit 930. The processing unit 930 is electrically connected to the pressure sensor 910 and the alert unit 920.

When the processing unit determines that the pressure value of the pressing portion sensed by the pressure sensor is greater than a preset threshold, the processing unit controls the alert unit to provide alerts. Thus, whenever the pressure sensor 910 senses a pressure value from the pressing portion 600, the processing unit 930 determines whether the pressure value sensed by the pressure sensor 910 is greater than a predetermined threshold. When the processing unit 930 determines that the pressure value sensed by the pressure sensor 910 is greater than the predetermined threshold, the processing unit 930 controls the alert unit 910 to provide alerts.

Thus, as long as the testing personnel pulls the second end 720 of the resilient spiral spring 700 for a certain length until the alert unit 910 starts to provide alerts, the testing personnel does not need to notice the pressure value sensed by the pressure sensor 910, or the lengths of the resilient spiral spring 700 which has been pulled out, thereby reducing the working difficulty for the testing personnel. In this embodiment, the alert unit 920 and the processing unit 930 are not limited to being disposed on the circuit board 100 or an external device other than the circuit board 100.

However, the disclosure in not limited thereto. In another embodiment of the disclosure, the fixing pins 800 and pressure sensor 910 mentioned above also can be collaborated together for improving the detection efficiency.

Figure 7:
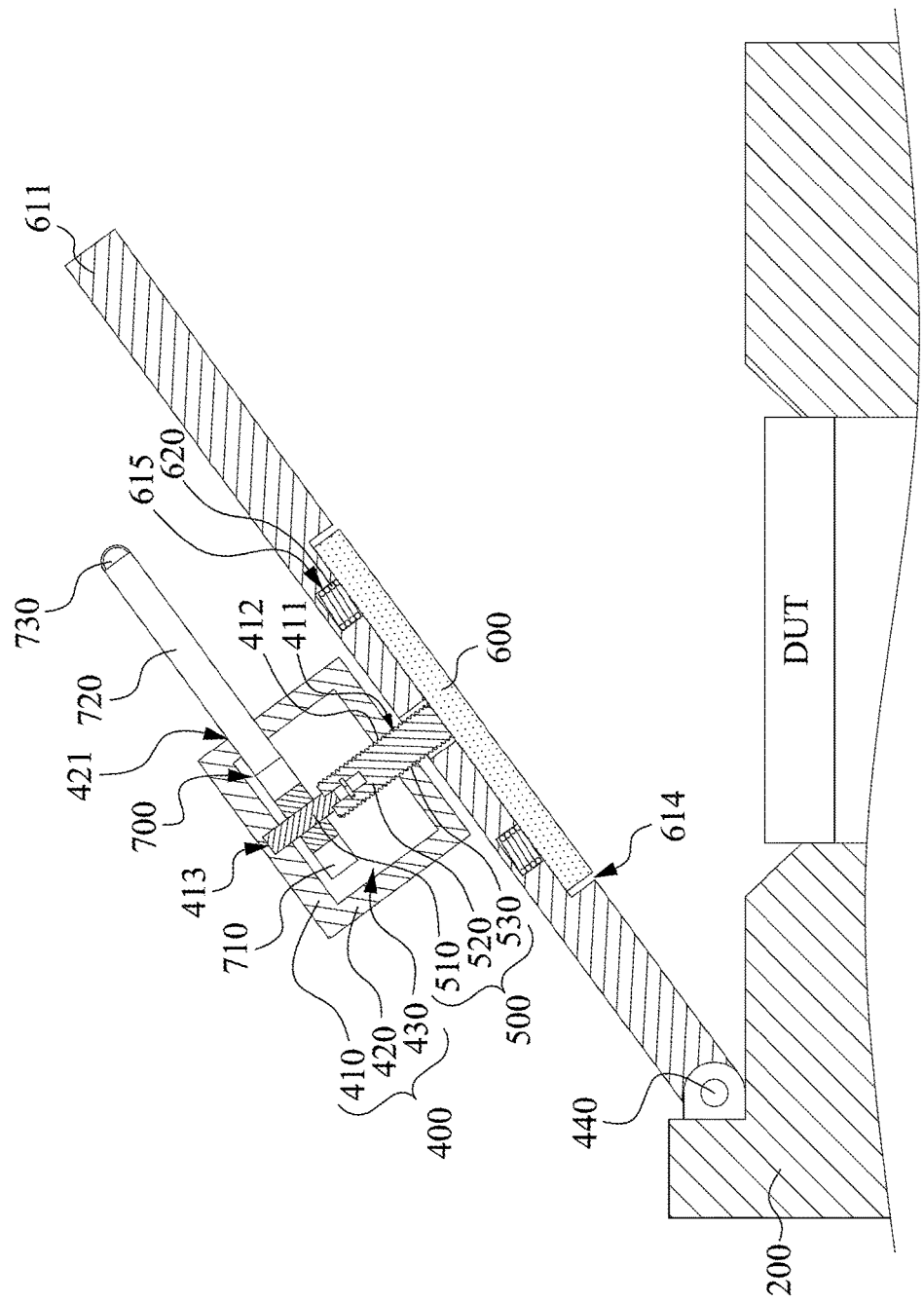
FIG. 7 is a schematic side view of a testing device according to one embodiment of the disclosure.

FIG. 7 is a schematic side view of a testing device 14 according to one embodiment of the disclosure. As shown in FIG. 7, the testing device 14 of FIG. 7 is substantially the same with the testing device 10 of FIG. 1, expect that the covering lid 611 is pivotally connected to one side of the carrier 200 through a pivot 440, such that the covering lid 611 can be rotated relative to the carrier 200 for moving the main body 400, the shaft 500, the pressing portion 600 and the resilient spiral spring 700 to cover or uncover the carrier 200. Thus, after the resilient spiral spring 700 is automatically restored to lift the pressing portion 600 away from the DUT in the original coiling state, the covering lid 611 can be rotated to uncover the carrier 200 and expose the DUT, such that the testing personnel can remove the DUT away from the carrier 200.

Figure 8:
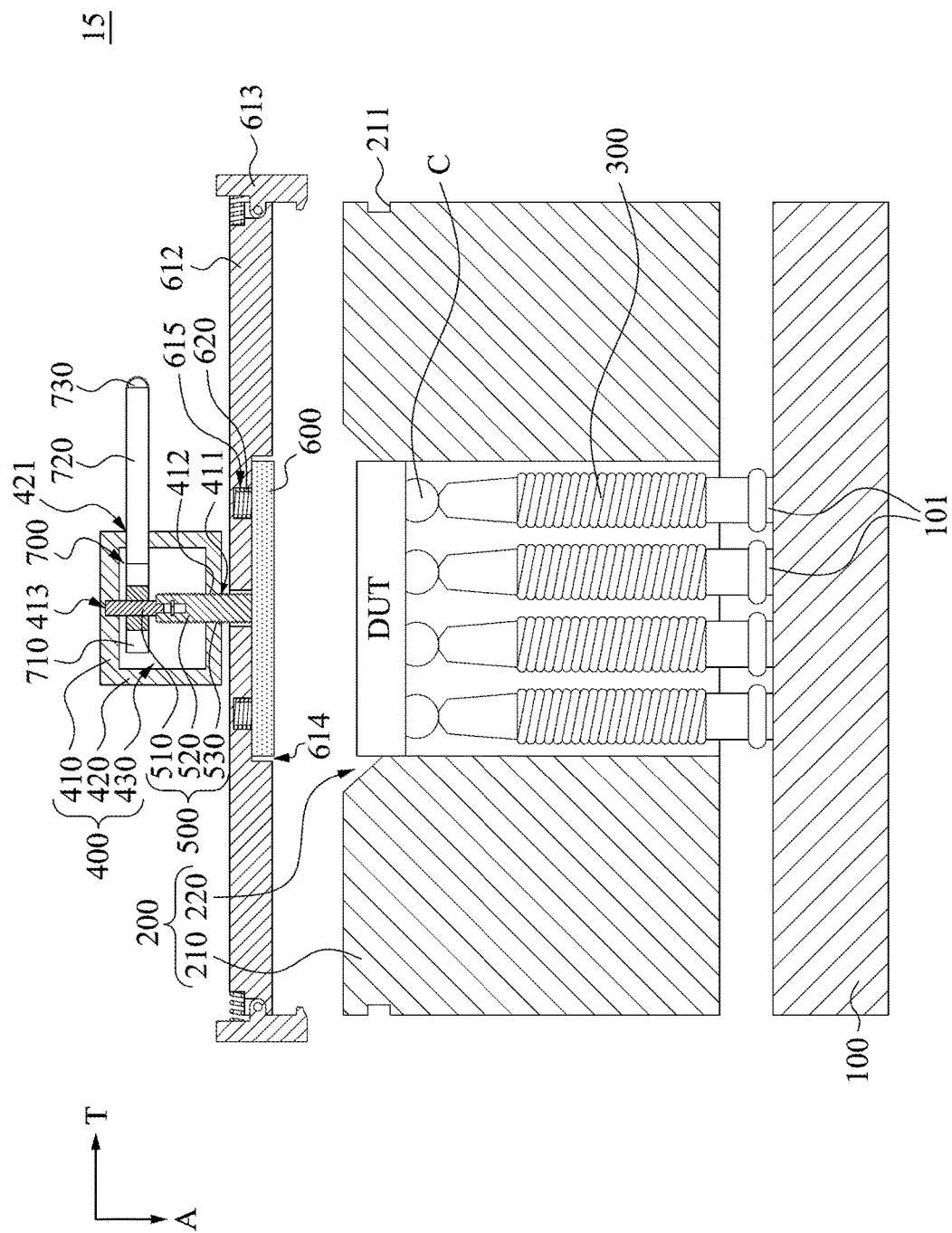
FIG. 8 is a schematic side view of a testing device according to one embodiment of the disclosure.

FIG. 8 is a schematic side view of a testing device 15 according to one embodiment of the disclosure. As shown in FIG. 8, the testing device 15 of FIG. 8 is substantially the same with the testing device 10 of FIG. 1, expect that the covering lid 612 which is connected to the shaft 500 is detachably connected to the carrier 200, such that the covering lid 612 can be linearly moved to cover or uncover the loading portion 220 (i.e., the DUT) of the carrier 200 in the axial direction A of the shaft 500. Additionally, the covering lid 612 is further provided with two first fastening portions 613 (e.g., resilient hook). The first fastening portions 613 are symmetrically arranged on two opposite sides of the covering lid 612, respectively. The carrier 200 is provided with two second fastening portions 211 (e.g., concave). The second fastening portions 211 are symmetrically formed on two opposite outer sides of the base 210, respectively. Therefore, when the covering lid 612 covers the loading portion 220 (i.e., the DUT) of the carrier 200, by the first fastening portions 613 engaged with the second fastening portions 211, the covering lid 612 can be secured on the base 210 of the carrier 200.

Figure 9:
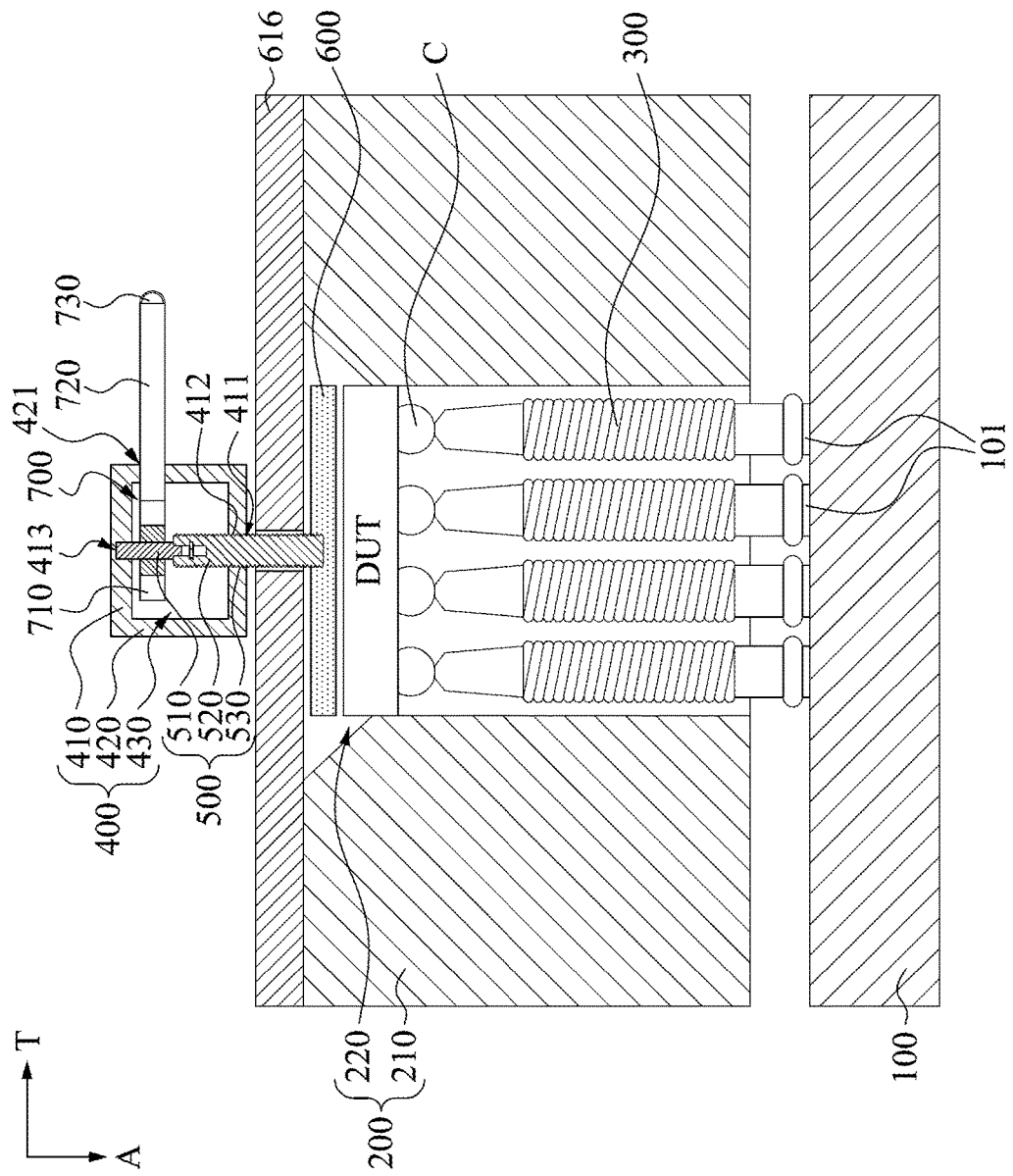
FIG. 9 is a schematic side view of a testing device according to one embodiment of the disclosure.

FIG. 9 is a schematic side view of a testing device 16 according to one embodiment of the disclosure. As shown in FIG. 9, the testing device 16 of FIG. 9 is substantially the same with the testing device 10 of FIG. 1, expect that the distal end of the shaft 500 is fixedly connected to the pressing portion 600 with screws or an adhesive after the shaft 500 penetrates through the covering lid 616. The pressing portion 600 is shaped as a cylindrical shape, bit the disclosure is not limited to the shape of the pressing portion 600. Thus, when the rotating shaft 500 descends to gradually approach the DUT in the axial direction A of the shaft 500, the shaft 500 moves the pressing portion 600 to rotate and descend synchronously for pressing the DUT.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A testing device, comprising:
    a main body;
    a circuit board;
    a carrier for carrying a device under test (DUT);
    at least one probe pin for electrically connecting to the circuit board and the DUT;
    a shaft movably connected to the main body in accordance with a screwing rotation method;
    a pressing portion connected to one end surface of the shaft; and
    a resilient spiral spring retractably coiled on the shaft, wherein one end of the resilient spiral spring located far away from the shaft extends in a transverse direction intersecting an axial direction of the shaft,
    wherein, when the one end of the resilient spiral spring is pulled out in the transverse direction for rotating the shaft, the shaft moves towards the DUT in the axial direction of the shaft to move the pressing portion to press the DUT for abutting against the at least one probe pin.

2. The testing device of claim 1, wherein the end surface of the shaft is oriented towards a surface of the pressing portion, and is rotatable in relation to the pressing portion,
    wherein, when the shaft moves towards the DUT in the axial direction of the shaft, the end surface of the shaft pushes the pressing portion to linearly move in the axial direction of the shaft.

3. The testing device of claim 2, further comprising:
    at least one elastic element connected to the pressing portion and a stationary object, wherein the stationary object is not moved with the shaft.

4. The testing device claim 1, wherein the end surface of the shaft is fixedly connected to the pressing portion,
    wherein, when the shaft moves towards the DUT in the axial direction of the shaft, the shaft is collectively rotated with the pressing portion about the axial direction of the shaft.

5. The testing device of claim 1, further comprising:
at least one fixing pin uprightly disposed on one surface of the circuit board for removably holding the one end of the resilient spiral spring which is pulled out.

6. The testing device of claim 5, wherein a minimum linear distance existing between the at least one fixing pin and the shaft is adjustable.

7. The testing device of claim 5, wherein the at least one fixing pin is slidably disposed on the one surface of the circuit board.

8. The testing device of claim 5, wherein the at least one fixing pin is detachably disposed on the one surface of the circuit board.

9. The testing device of claim 1, further comprising:
a pressure sensor disposed on one surface of the pressing portion facing the carrier for sensing a pressure value of the pressing portion directly pushing the DUT.

10. The testing device of claim 9, wherein the pressing portion is formed with a concaved portion on the one surface of the pressing portion facing the carrier, and the pressure sensor is received in the concaved portion, wherein one surface of the pressure sensor is coplanar with the one surface of the pressing portion facing the carrier.

11. The testing device of claim 9, further comprising:
an alert unit; and
a processing unit electrically connected to the pressure sensor and the alert unit, wherein, when the processing unit determines that the pressure value of the pressing portion sensed by the pressure sensor is greater than a predetermined threshold, the processing unit controls the alert unit to provide alerts.

12. The testing device of claim 1, further comprising:
a covering lid pivotally connected to the carrier, and connected to the shaft, for covering the DUT.

13. The testing device of claim 1, further comprising:
a covering lid detachably connected to the carrier, and connected to the shaft, for covering the DUT.

* * * * *